(12) United States Patent
Kurashige et al.

(10) Patent No.: US 7,510,671 B2
(45) Date of Patent: Mar. 31, 2009

(54) INORGANIC SCINTILLATOR AND PROCESS FOR ITS FABRICATION

(75) Inventors: Kazuhisa Kurashige, Hitachinaka (JP); Naoaki Shimura, Hitachinaka (JP); Hiroyuki Ishibashi, Tsukuba (JP); Keiji Sumiya, Tsukuba (JP); Tatsuya Usui, Hitachinaka (JP); Shigenori Shimizu, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 337 days.

(21) Appl. No.: 11/154,824

(22) Filed: Jun. 17, 2005

(65) Prior Publication Data

US 2006/0000408 A1  Jan. 5, 2006

(30) Foreign Application Priority Data

Jun. 18, 2004 (JP) .......................... P2004-181507

(51) Int. Cl.
*C09K 11/79* (2006.01)
*G01T 1/202* (2006.01)
*C30B 15/00* (2006.01)

(52) U.S. Cl. ............................. 252/301.4 F; 117/942; 250/361 R; 250/370.12

(58) Field of Classification Search ........... 252/301.4 F; 117/942; 250/361 R, 370.12
See application file for complete search history.

(56) References Cited

U.S. PATENT DOCUMENTS

| | | | |
|---|---|---|---|
| 4,958,080 A | 9/1990 | Meicher | |
| 5,264,154 A * | 11/1993 | Akiyama et al. | 252/301.4 F |
| 5,660,627 A | 8/1997 | Manente et al. | |
| 6,278,832 B1 | 8/2001 | Zagumennyl et al. | |
| 6,413,311 B2 | 7/2002 | Meicher et al. | |
| 6,437,336 B1 | 8/2002 | Pauwels et al. | |
| 7,067,815 B2 | 6/2006 | Dorenbos et al. | |
| 7,166,845 B1 | 1/2007 | Chai | |
| 7,202,477 B2 | 4/2007 | Srivastava et al. | |
| 7,233,006 B2 | 6/2007 | Dorenbos et al. | |
| 7,282,161 B2 | 10/2007 | Kurashige et al. | |
| 7,282,718 B2 | 10/2007 | Shimizu et al. | |
| 7,297,954 B2 * | 11/2007 | Kurashige et al. | 250/361 R |
| 7,301,154 B2 | 11/2007 | Kurashige et al. | |
| 2003/0062465 A1 | 4/2003 | Pauwels et al. | |
| 2004/0061058 A1 | 4/2004 | Williams | |
| 2005/0173676 A1 | 8/2005 | Kurashige et al. | |
| 2005/0279944 A1 | 12/2005 | Kurashige et al. | |
| 2006/0000408 A1 | 1/2006 | Kurashige et al. | |
| 2006/0054831 A1 | 3/2006 | Shimizu et al. | |
| 2006/0086311 A1 | 4/2006 | Zagumennyl et al. | |
| 2006/0266945 A1 | 11/2006 | Kurashige et al. | |
| 2007/0289525 A1 | 12/2007 | Kurashige et al. | |

FOREIGN PATENT DOCUMENTS

| | | |
|---|---|---|
| JP | 62-8472 | 2/1987 |
| JP | 7-78215 | 8/1995 |
| JP | 2001-524163 | 11/2001 |

OTHER PUBLICATIONS

G.B. Loutts et al., Czochralski Growth and Characterization of $(Lu_{1-x}Gd_x)_2SiO_5$ Single Crystals for Scintillators, Journal of Crystal Growth, 174, pp. 331-336, 1997.

* cited by examiner

*Primary Examiner*—C. Melissa Koslow
(74) *Attorney, Agent, or Firm*—Antonelli, Terry, Stout & Kraus, LLP.

(57) ABSTRACT

The inorganic scintillator of the invention is an inorganic scintillator capable of producing scintillation by radiation, which is a crystal comprising a metal oxide containing Lu, Gd, Ce and Si and belonging to space group C2/c monoclinic crystals, and which satisfies the condition specified by the following inequality (1A), wherein $A_{Lu}$ represents the number of Lu atoms in the crystal and $A_{Gd}$ represents the number of Gd atoms in the crystal.

$$\{A_{Lu}/(A_{Lu}+A_{Gd})\}<0.50 \qquad (1A)$$

4 Claims, 10 Drawing Sheets

INORGANIC SCINTILLATOR AND PROCESS FOR ITS FABRICATION

BACKGROUND OF THE INVENTION

1. Field of the Invention

The present invention relates to an inorganic scintillator and to a process for its fabrication.

2. Related Background of the Invention

In an apparatus used for Positron Emission (computed) Tomography (hereinafter, "PET"), the optical characteristics (wavelength conversion characteristics, etc.) of the scintillator mounted therein has a major effect on the imaging performance of the apparatus, and therefore improvement in the optical characteristics of the scintillator is the most important factor for enhancing the imaging performance of such apparatuses. Researchers are therefore actively exploring scintillator materials which can be used to construct scintillators with excellent optical characteristics, and are developing manufacturing techniques such as crystal growth techniques for realizing such scintillators.

In the field of high-energy physics as well, experiments for detection and analysis of high-energy microparticles arriving to earth from outer space require implementation of scintillators which allow efficient detection of high-energy microparticles.

Scintillators mounted in PET apparatuses include those which require high fluorescent output, those which require short fluorescent decay times and those which require high energy resolution. Particularly from the standpoint of relieving the burden on subjects being examined by PET, the examination time per subject must be shortened and therefore scintillators with short fluorescent decay times are desired. The intensity of a fluorescent pulse outputted upon incidence of a radiation pulse into a scintillator typically undergoes time-dependent change in the manner shown in FIG. 1.

As scintillators designed for shorter fluorescent decay times there are known, for example, inorganic scintillators having a construction comprising Ce (cerium) as a luminescent center in a matrix material composed of a compound metal oxide containing a lanthanoid (for example, see Japanese Examined Patent Publication No. 62-8472). Examples of known inorganic scintillators include scintillators having a chemical composition represented by the general formula: $Ce_\alpha Ln_{2-\alpha}SiO_5$ or the general formula: $Ce_\beta Ln_{2-\beta}AlO_3$, where $0<\alpha<0.1$, $0<\beta<0.1$, and Ln (lanthanoid) represents Sc (scandium), Y (yttrium), La (lanthanum), Gd (gadolinium) or Lu (lutetium).

In particular, scintillators having a chemical composition represented by the general formula: $Ce_\alpha Ln_{2-\alpha}SiO_5$ have high fluorescent output and are therefore widely employed for PET. As specific examples of such inorganic scintillators there may be mentioned "ALLEGRO™" by Philips Medical Systems which employs $Ce_\alpha Gd_{2-\alpha}SiO_5$ and "ECAT ACCEL™" by Siemens which employs $Ce_\alpha Lu_{2-\alpha}SiO_5$.

Japanese Examined Patent Publication No. 7-78215 discloses a single-crystal scintillator represented by the general formula: $Ce_\alpha(Lu_\gamma Gd_{2-\gamma})_{2-\alpha}SiO_5$. Also, in Japanese Patent Application Laid-Open No. 2001-524163 (also in Journal of Crystal Growth 174(1997), p. 331-336) it is attempted to reduce the Lu content by including Ta (tantalum), W (tungsten), Ca (calcium) and F (fluorine) in a single-crystal scintillator represented by $Ce_\alpha(Lu_\gamma Gd_{2-\gamma})_{2-\alpha}SiO_5$.

SUMMARY OF THE INVENTION

However, when the present inventors conducted a detailed examination of conventional inorganic scintillators including those described in the aforementioned publications, it was found that the inorganic scintillator described in Japanese Examined Patent Publication No. 62-8472 composed of $Ce_\alpha Gd_{2-\alpha}SiO_5$ has a slow rise in fluorescence (fluorescent intensity) output from the scintillator after radiation absorption, and therefore the energy time resolution is insufficiently high. Also, it has been demonstrated that the scintillator composed of $Ce_\alpha Lu_{2-\alpha}SiO_5$ generates considerable noise in the fluorescence outputted upon incidence of charged particles from a subject. This noise lowers the detection precision of the charged particles from the subject.

The present inventors have also discovered that the scintillator composed of $Ce_\alpha(Lu_\gamma Gd_{2-\gamma})_{2-\alpha}SiO_5$ as described in Japanese Examined Patent Publication No. 7-78215 tends to have a notably inhibited scintillator function when the Lu content ratio is relatively high, as compared to when the Lu content ratio is relatively low.

It has also been shown that the scintillator described in Japanese Patent Application Laid-Open No. 2001-524163 does not permit adequate reduction in the noise effect even when Ta, W, Ca and F are included.

The present invention has been accomplished in light of these circumstances, and its object is to provide an inorganic scintillator with an adequately rapid rise time of fluorescence outputted upon absorption of radiation and sufficiently low fluorescent noise, as well as a process for its fabrication.

The present inventors conducted much diligent research with the aim of achieving the object stated above, and discovered that the problem discussed above can be overcome by reducing the Lu in inorganic scintillators comprising metal oxides including Lu, Gd, Ce and Si (silicon) to a prescribed ratio, and by forming the single crystal of the inorganic scintillator so that it has a crystal structure belonging to a prescribed space group.

More specifically, the present inventors discovered that when the crystalline structures of inorganic scintillators which are crystals comprising metal oxides including Lu, Gd, Ce and Si belong to the space group C2/c, the fluorescence rise time upon absorption of radiation is drastically shorter compared to the space group $P2_1/c$. Here, the "fluorescence rise time" is the time (t) required to rise from the point at which the intensity of outputted fluorescence is at 10% of the maximum value ($I_{max}$) (0.1 $I_{max}$), to the point at which it is at 90% (0.9 $I_{max}$) (see FIG. 1), when a scintillator absorbs radiation.

Furthermore, when the Lu content is high in an inorganic scintillator as a crystal comprising a metal oxide including Lu, Gd, Ce and Si, since Lu includes approximately 2.6% of its radioactive isotope $^{176}$Lu as the natural abundance ratio, the natural radiation of beta decay entering the scintillator is a cause of fluorescent noise outputted by the scintillator. The present inventors completed this invention after much additional research based on this finding.

The inorganic scintillator of the present invention is an inorganic scintillator capable of producing scintillation by radiation, which is a crystal comprising a metal oxide containing Lu, Gd, Ce and Si and belonging to space group C2/c monoclinic crystals, and by satisfying the condition specified by the following inequality (1A). Throughout the present specification, Si is also considered to be included among the "metals" of the "metal oxide".

$$\{A_{Lu}/(A_{Lu}+A_{Gd})\}<0.50 \quad (1A)$$

In inequality (1A), $A_{Lu}$ represents the number of Lu atoms in the crystal and $A_{Gd}$ represents the number of Gd atoms in the crystal.

The inorganic scintillator of the invention has a very short fluorescent rise time of no greater than 2 nanoseconds, thus allowing the object stated above to be achieved, while the workability also tends to be superior, with greater resistance to cracking during polishing, for example, as compared to scintillators with crystals belonging to P2$_1$/c or scintillators wherein $\{A_{Lu}/(A_{Lu}+A_{Gd})\}$ is 0.50 or greater.

The inorganic scintillator of the invention preferably satisfies the condition specified by the following inequality (2A), because this will allow the fluorescent rise time to be further shortened and the fluorescent noise to be further reduced.

$$0.10<\{A_{Lu}/(A_{Lu}+A_{Gd})\}<0.40 \quad (2A)$$

The inorganic scintillator of the invention may further comprise Y in the metal oxide, where the condition specified by the following inequality (1B) is satisfied.

$$\{(A_{Lu}+A_Y)/(A_{Lu}+A_Y+A_{Gd})\}<0.50 \quad (1B)$$

In inequality (1B), $A_{Lu}$ represents the number of Lu atoms in the crystal, $A_Y$ represents the number of Y atoms in the crystal, and $A_{Gd}$ represents the number of Gd atoms in the crystal.

In this case, the inorganic scintillator of the invention preferably satisfies the condition specified by the following inequality (2B), because this will allow the fluorescent rise time to be further shortened and the fluorescent noise to be further reduced.

$$0.10<\{(A_{Lu}+A_Y)/(A_{Lu}+A_Y+A_{Gd})\}<0.40 \quad (2B)$$

The inorganic scintillator of the invention is preferably in the state of a single crystal, since this will allow excellent scintillation properties to be achieved more reliably.

The process for fabrication of an inorganic scintillator according to the invention comprises a melting step in which the raw material for the inorganic scintillator is brought to a molten state by a melting method to obtain a melt, a cooling and solidification step in which the melt is cooled to solidification to obtain a single crystal ingot, and a cutting step in which the single crystal ingot is cut out to a prescribed shape and size. The inorganic scintillator described above can be fabricated using this fabrication process.

From the viewpoint of more reliably obtaining an inorganic scintillator as described above by the inorganic scintillator fabrication process of the invention, preferably at least a portion of a seed crystal is dipped in the melt prior to cooling and solidification of the melt in the cooling and solidification step, and a crystal is grown along a prescribed crystal plane of the seed crystal to obtain a single crystal ingot.

From the same viewpoint, the seed crystal is preferably a crystal comprising a metal oxide containing Lu, Gd and Si and belonging to space group C2/c monoclinic crystals. Also, from the same viewpoint, the seed crystal more preferably satisfies the condition specified by the following inequality (3A), and most preferably satisfies the condition specified by the following inequality (4A).

$$\{B_{Lu}/(B_{Lu}+B_{Gd})\}<0.50 \quad (3A)$$

$$0.10<\{B_{Lu}/(B_{Lu}+B_{Gd})\}<0.40 \quad (4A)$$

In inequalities (3A) and (4A), $B_{Lu}$ represents the number of Lu atoms in the seed crystal and $B_{Gd}$ represents the number of Gd atoms in the seed crystal.

In the process for fabrication of an inorganic scintillator according to the invention, the metal oxide may further comprise Y and the seed crystal may satisfy the condition specified by the following inequality (3B). In this case, the seed crystal preferably satisfies the condition specified by the following inequality (4B).

$$\{(B_{Lu}+B_Y)/(B_{Lu}+B_Y+B_{Gd})\}<0.50 \quad (3B)$$

$$0.10<\{(B_{Lu}+B_Y)/(B_{Lu}+B_Y+B_{Gd})\}<0.40 \quad (4B)$$

In inequalities (3B) and (4B), $B_{Lu}$ represents the number of Lu atoms in the seed crystal, $B_Y$ represents the number of Y atoms in the seed crystal and $B_{Gd}$ represents the number of Gd atoms in the seed crystal.

The inorganic scintillator of the invention as described above can be obtained by the fabrication process for an inorganic scintillator according to the invention even if the seed crystal used is a crystal comprising a metal oxide containing Y and Si or a metal oxide containing Lu and Si and essentially no Gd, and belonging to space group C2/c monoclinic crystals.

According to the invention, it is possible to provide an inorganic scintillator having an adequately rapid rise time for fluorescence outputted upon absorption of radiation and sufficiently reduced fluorescent noise, as well as a process for its fabrication.

The inorganic scintillator of the invention may be utilized as a scintillator mounted in a PET apparatus, a scintillator for high-energy physics research, or the like.

DESCRIPTION OF THE PREFERRED EMBODIMENTS

Figure 1:
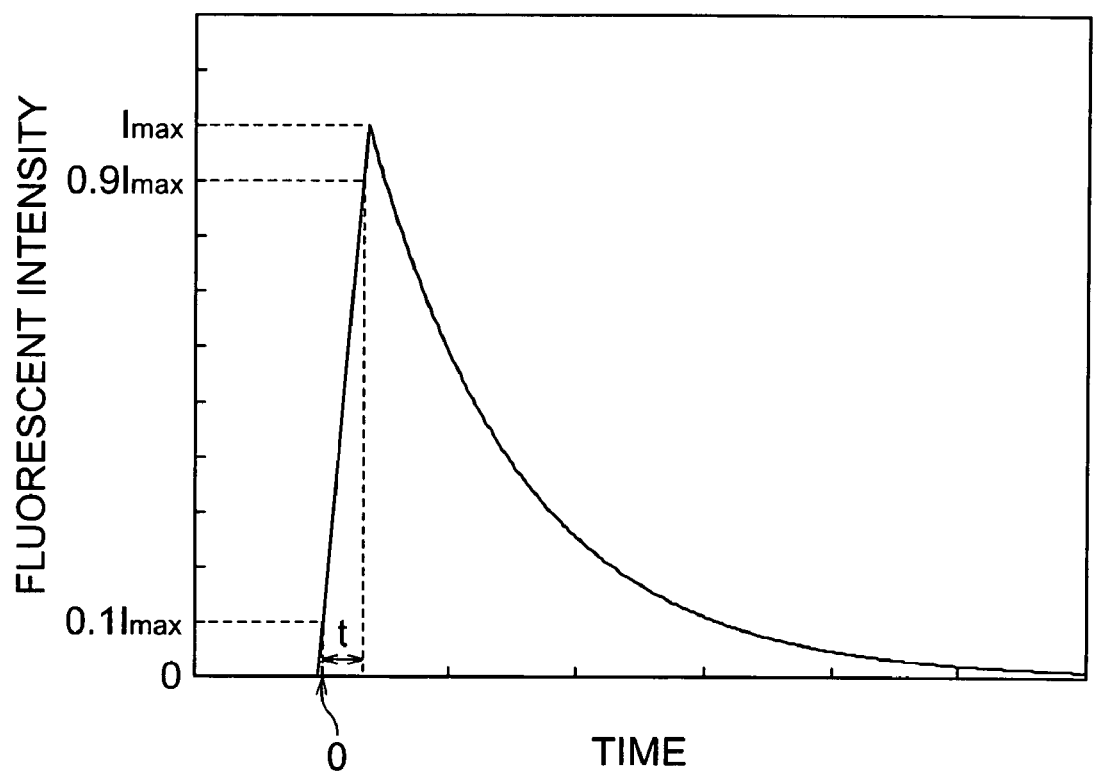
FIG. 1 is a graph schematically showing time-dependent change in intensity of a fluorescent pulse outputted from a scintillator.

Preferred embodiments of the present invention will now be explained in detail with reference to the accompanying drawings as necessary. Throughout the drawings, corresponding elements will be indicated by like reference symbols and will be explained only once. Unless otherwise specified, the vertical and horizontal positional relationships are based on the positional relationships in the drawings. The dimensional proportions in the drawings are not restricted to the proportions shown.

An inorganic scintillator according to a preferred embodiment of the invention is capable of producing scintillation by radiation, which is a single crystal comprising a metal oxide containing Lu, Gd, Ce and Si and belonging to space group C2/c monoclinic crystals, and by satisfying the condition specified by the following inequality (1A).

$$\{A_{Lu}/(A_{Lu}+A_{Gd})\}<0.50 \tag{1A}$$

(wherein $A_{Lu}$ represents the number of Lu atoms in the crystal and $A_{Gd}$ represents the number of Gd atoms in the crystal).

Lu includes approximately 2.6% of its radioactive isotope $^{176}$Lu as the natural abundance ratio, and the natural radiation of beta decay is a cause of noise when this element is used as a scintillator. From this viewpoint, therefore, a lower Lu content ratio in the inorganic scintillator is preferred. For precise and accurate detection of information relating to radiation from a subject, the number of Lu atoms in the crystal must satisfy the condition specified by inequality (1) above, and preferably satisfies the condition specified by the following inequality (5).

$$\{A_{Lu}/(A_{Lu}+A_{Gd})\}<0.40 \tag{5}$$

On the other hand, if $\{A_{Lu}/(A_{Lu}+A_{Gd})\}$ is less than 0.10, it will be difficult to obtain a single crystal belonging to the space group C2/c, as the single crystal will tend to belong to the space group $P2_1/c$. A scintillator composed of a single crystal belonging to the space group $P2_1/c$ will not easily exhibit a fluorescence rise time of 2 nanoseconds or shorter upon absorption of radiation and will tend to have a notably lower time resolution, compared to a single crystal belonging to the space group C2/c.

In order to more reliably obtain excellent scintillation properties for the inorganic scintillator in consideration of the above, the condition specified by the following inequality (2A) is preferably satisfied.

$$0.10<\{A_{Lu}/(A_{Lu}+A_{Gd})\}<0.40 \tag{2A}$$

The inorganic scintillator of the invention may further comprise Y (yttrium) in the metal oxide. In this case, the numbers of Lu and Y atoms in the crystal preferably satisfy the condition specified by the following inequality (1B), and more preferably satisfy the condition specified by the following inequality (2B). If these conditions are satisfied, it will be possible to minimize reduction in the time resolution and more reliably obtain excellent scintillation properties for the inorganic scintillator.

$$\{(A_{Lu}+A_Y)/(A_{Lu}+A_Y+A_{Gd})\}<0.50 \tag{1B}$$

$$0.10<\{(A_{Lu}+A_Y)/(A_{Lu}+A_Y+A_{Gd})\}<0.40 \tag{2B}$$

In inequalities (1B) and (2B), $A_{Lu}$ represents the number of Lu atoms in the crystal, $A_Y$ represents the number of Y atoms in the crystal, and $A_{Gd}$ represents the number of Gd atoms in the crystal.

Throughout the present specification, "radiation" refers to particle rays (α rays, β rays, γ rays, X-rays, etc.) having sufficient energy to ionize atoms or molecules.

The inorganic scintillator of this embodiment preferably satisfies the condition specified by the following inequality (6).

$$0.0001\leq\{A_{Ce}/(A_{Lu}+A_{Gd})\}\leq0.05 \tag{6}$$

(wherein $A_{Ce}$ represents the number of Ce atoms in the crystal. Ce functions primarily as the luminescent center, and adjustment of the Ce content ratio to within the range of inequality (6) will tend to further increase the luminescence of the scintillator.

A preferred mode of a process for fabrication of an inorganic scintillator according to the invention (an example of a fabrication process for obtaining a rare earth silicic acid salt single crystal as a single crystal for a metal oxide) will now be explained.

The fabrication process for an inorganic scintillator according to this mode is a fabrication process for an inorganic scintillator which is a rare earth silicic acid salt single crystal comprising Lu, Gd, Ce and Si, and it comprises a melting step in which the raw material for the inorganic scintillator brought to a molten state by a melting method, a cooling and solidification step in which a portion of a seed crystal is dipped in the melt and the melt in which the seed crystal has been dipped is cooled to solidification to grow the crystal along a prescribed crystal plane of the seed crystal and obtain a single crystal ingot, and a cutting step in which the single crystal ingot is cut out to a prescribed shape and size.

From the standpoint of more reliably obtaining an inorganic scintillator according to this mode, the melting method in the melting step is preferably a Czochralski process. In this case, a lifting apparatus 10 having the construction shown in FIG. 2 is preferably used for the operation in the melting step and cooling and solidification step.

Figure 2:
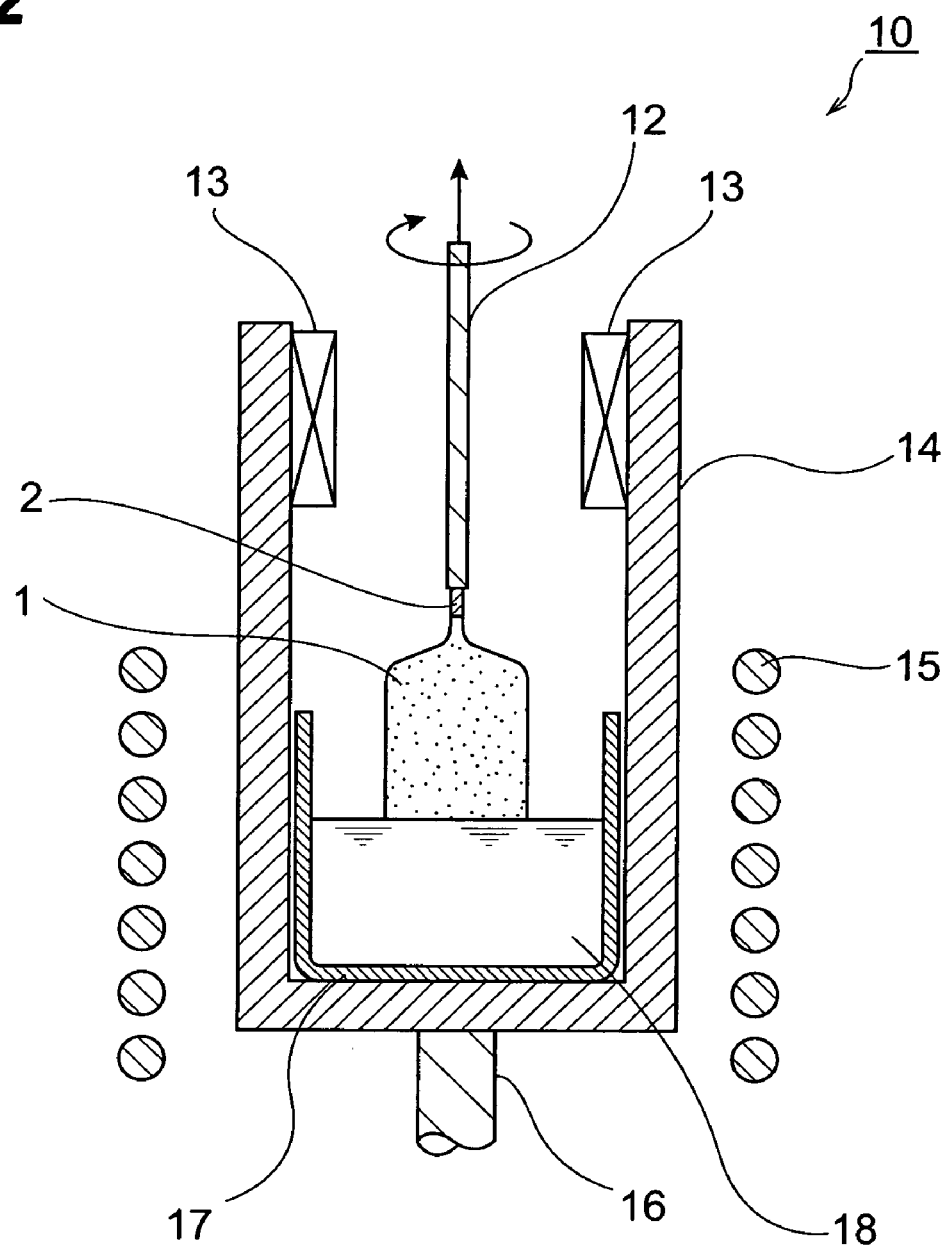
FIG. 2 is a schematic cross-sectional view showing an example of the basic construction of an apparatus for fabrication of an inorganic scintillator of the invention.

FIG. 2 is a schematic diagram showing an example of the basic construction of an apparatus for fabrication of an inorganic scintillator according to this embodiment.

The lifting apparatus 10 shown in FIG. 2 has a high-frequency induction heating furnace (two-zone hot growth furnace) 14. The high-frequency induction heating furnace 14 is used for continuous operation in the melting step and the cooling and solidification step described above.

The high-frequency induction heating furnace 14 is a refractory closed-bottom container with a cylindrical wall, and the shape of the closed-bottom container is the same as one used for single crystal growth based on the Czochralski process. A high-frequency induction coil 15 is wound on the outside of the bottom of the high-frequency induction heating furnace. Also, a crucible 17 (for example, a crucible made of Ir (iridium)) is set on the bottom inside the high-frequency induction heating furnace 14. The crucible 17 also serves as a high-frequency induction heater. The starting material for the inorganic scintillator is loaded into the crucible 17, and application of high-frequency induction by the high-frequency induction coil 15 heats the crucible 17 and produces a melt 18 composed of the constituent material of the inorganic scintillator.

A heater 13 (resistance heater) is also set at the top inner wall without contacting the melt 18 in the high-frequency induction heating furnace 14. This heater allows independent control of the heating output with respect to the high-frequency induction coil 15.

At the center bottom of the high-frequency induction heating furnace 14 there is provided an opening (not shown) which passes from the inside to the outside of the high-frequency induction heating furnace 14. Through this opening there is inserted a crucible support rod 16, from the outside of the high-frequency induction heating furnace 14, and the tip of the crucible support rod 16 is connected to the bottom of the crucible 17. Rotating the crucible support rod 16 allows the crucible 17 to be rotated in the high-frequency induction heating furnace 14. The area between the opening and the crucible support rod 16 is sealed with packing or the like.

A more specific fabrication method using a lifting apparatus 10 will now be explained.

First in the melting step, the starting material for the single crystal of the inorganic scintillator is loaded into the crucible 17, and application of high-frequency induction to the high-frequency induction coil 15 produces a melt 18 composed of the constituent material of the inorganic scintillator. The starting material for the single crystal may be, for example, a simple oxide of a rare earth metal or Si which is to compose the single crystal.

Next, in the cooling and solidification step, the melt is cooled to solidity to obtain a cylindrical inorganic scintillator single crystal ingot 1. More specifically, the operation proceeds through two steps, the growth step described below and a cooling step.

First, in the growth step, a lifting rod 12 having the seed crystal 2 anchored to the lower end is dipped into the melt 18 from the top of the high-frequency induction heating furnace, and then the lifting rod 12 is raised while forming the inorganic scintillator single crystal ingot 1. The heating output from the heater 13 is adjusted in the growth step, so that the inorganic scintillator single crystal ingot 1 raised from the melt 18 grows to have a cross-section with the prescribed diameter.

From the viewpoint of more reliably obtaining a single crystal belonging to the space group C2/c, the seed crystal serving as the nucleus of the single crystal ingot 1 is preferably a single crystal belonging to the space group C2/c. Specifically, the single crystal is more preferably a rare earth silicic acid salt single crystal, and more preferably one comprising Lu, Gd or Y as the rare earth element. Thus, it may include a rare earth silicic acid salt containing Lu and Gd, a rare earth silicic acid salt containing Y, a rare earth silicic acid salt containing Lu but containing essentially no Gd (i.e., containing Gd only as an avoidable impurity), or the like. Among such materials, using a single crystal composed of a rare earth silicic acid salt containing Lu and Gd as the seed crystal will allow the inorganic scintillator to be fabricated in a more reliable manner.

When the seed crystal used is a single crystal composed of a rare earth silicic acid salt containing Lu and Gd, the single crystal preferably satisfies the condition specified by the following inequality (3A) and more preferably satisfies the condition specified by the following inequality (4A), from the standpoint of obtaining a scintillator exhibiting very excellent scintillation properties.

$$\{B_{Lu}/(B_{Lu}+B_{Gd})\} < 0.50 \quad (3A)$$

$$0.10 < \{B_{Lu}/(B_{Lu}+B_{Gd})\} < 0.40 \quad (4A)$$

In inequalities (3A) and (4A), $B_{Lu}$ represents the number of Lu atoms in the seed crystal and $B_{Gd}$ represents the number of Gd atoms in the seed crystal.

The seed crystal may be a single crystal further comprising Y. In this case, the single crystal preferably satisfies the condition specified by the following inequality (3B) and more preferably satisfies the condition specified by the following inequality (4B).

$$\{(B_{Lu}+B_Y)/(B_{Lu}+B_Y+B_{Gd})\} < 0.50 \quad (3B)$$

$$0.10 < \{(B_{Lu}+B_Y)/(B_{Lu}+B_Y+B_{Gd})\} < 0.40 \quad (4B)$$

In inequalities (3B) and (4B), $B_{Lu}$ represents the number of Lu atoms in the seed crystal, $B_Y$ represents the number of Y atoms in the seed crystal and $B_{Gd}$ represents the number of Gd atoms in the seed crystal.

Next, in the cooling step, the heating output of the heater is adjusted for cooling of the grown single crystal ingot (not shown) obtained after the growth step.

From the viewpoint of adequately preventing cracks in the single crystal and more reliably growing the single crystal of the inorganic scintillator, the gas phase in the high-frequency induction heating furnace 14 during the operation of the melting step and cooling and solidification step is preferably composed of a mixed gas whose major component is an inert gas satisfying the condition represented by the following inequality (7).

$$100 \times \{G/(E+G)\} \leq 2.0 (\%) \quad (7)$$

In formula (7), E represents the partial pressure of the inert gas in the mixed gas, and G represents the partial pressure of the oxygen gas in the mixed gas. According to the invention, "inert gas" means a noble gas or nitrogen gas.

If the value of $\{G/(E+G)\}$ exceeds 2.0%, more coloration will tend to be produced in the crystal, lowering the scintillator performance. If the value of $\{G/(E+G)\}$ exceeds 4.0%, and Ir is used as the constituent material of the crucible, vaporization of the structural material will proceed vigorously, hampering growth of the crystal.

Next, in the cutting step, the single crystal ingot 1 of the inorganic scintillator is cut to the prescribed shape and size to obtain an inorganic scintillator single crystal.

The above detailed explanation of a preferred mode of the invention is not intended to restrict the scope of the invention to this particular mode. For example, the inorganic scintillator of the invention may be polycrystalline in its solid state. If the inorganic scintillator of the invention is polycrystalline, it may be obtained by a sol-gel production process in the same manner as conventional polycrystalline scintillators.

EXAMPLES

The present invention will now be explained in greater detail through the following examples, with the understanding that these examples are in no way limitative on the invention.

Example 1

Figure 3:
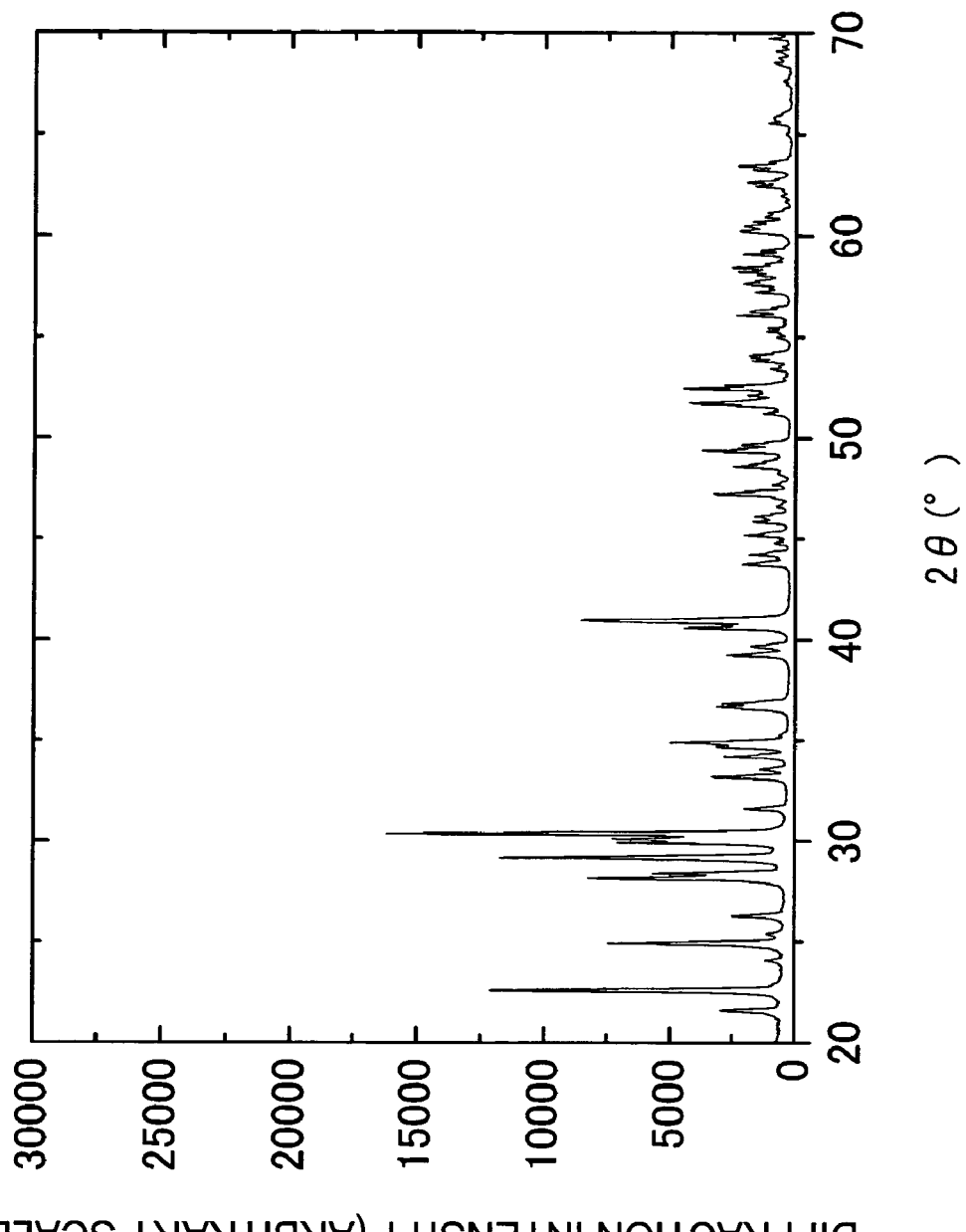
FIG. 3 shows an X-ray diffraction pattern for an inorganic scintillator according to an example of the invention.

In an Ir crucible having the same shape shown in FIG. 3 with a diameter of 50 mm, a height of 50 mm and a thickness of 1.5 mm there were loaded 316.84 g of gadolinium oxide ($Gd_2O_3$, 99.99 wt % purity), 87.06 g of lutetium oxide ($Lu_2O_3$, 99.99 wt % purity), 65.73 g of silicon dioxide ($SiO_2$, 99.99 wt % purity) and 0.38 g of cerium oxide ($CeO_2$, 99.99 wt % purity) as the starting materials, and 470.01 g of the mixture was obtained. The mixture was then heated to melting at 1950° C. or higher in a high-frequency induction heating furnace to obtain a melt (chemical composition of melt: $Ce_{0.002}Lu_{0.4}Gd_{1.598}SiO_5$) (melting step).

Next, the end of the lifting rod to which the seed crystal was anchored was placed in the melt for crystal growth. The seed crystal used was a cut-out single crystal composed of a metal oxide containing $Ce_{0.002}Lu_{0.4}Gd_{1.598}SiO_5$, obtained by an ordinary crystal growth method. After growth of the single crystal and before its cutting (trimming), the crystal structure was confirmed to be a single crystal belonging to the space group C2/c using a powder X-ray diffraction apparatus RAD™, product of Rigaku Corp.).

Next, a single crystal ingot with a neck diameter of 8 mmφ was lifted at a lifting speed of 3-10 mm/h to form a neck section. The cone section (cylinder trunk) was then lifted, initiating lifting of the cylinder trunk when the diameter reached 25 mmφ. The cylinder trunk was grown, and then the single crystal ingot was cut off from the melt and cooling was initiated. After completion of the cooling, the obtained single crystal was cut out (cooling and solidification step).

The obtained single crystal ingot had a crystal mass of about 308.13 g, a cone length of about 10 mm, a cylinder trunk length of about 70 mm and a cylinder trunk diameter of about 25 mm.

Next, an inductively coupled plasma (ICP) mass spectrometer (SPQ9000™ by Seiko Instruments) was used to determine the Lu concentration ($A_{Lu}/(A_{Lu}+A_{Gd})$), Gd concentration ($A_{Gd}/(A_{Lu}+A_{Gd})$) and Ce concentration ($A_{Ce}/(A_{Lu}+A_{Gd})$) of the single crystal. The measurement results are shown in Table 1.

TABLE 1

|  | Lu | Gd | Ce |
|---|---|---|---|
| Crystal top | 0.22 | 0.78 | 0.0004 |
| Crystal midsection | 0.21 | 0.79 | 0.0005 |
| Crystal bottom | 0.19 | 0.81 | 0.0007 |

Next, part of the bottom of the obtained single crystal was cut out and worked into powder. The resulting powder was combined with a silicon powder standard sample and the crystal structure was identified using a powder X-ray diffraction apparatus (RAD™, product of Rigaku Corp.). The resulting X-ray diffraction pattern is shown in FIG. 3. From the X-ray diffraction pattern it was demonstrated that the single crystal belonged to the space group C2/c, and had lattice constants a=14.492 Å, b=10.528 Å, c=6.766 Å, γ=122.2°.

Next, an approximately cuboid sample (inorganic scintillator single crystal) with a size of 4 mm×6 mm×20 mm was cut out from the obtained single crystal ingot (cutting step). An inner perimeter cutter was used for the cutting, and the blade of the inner perimeter cutter was a blade electrodeposited with #325-400 natural diamond.

Figure 4:
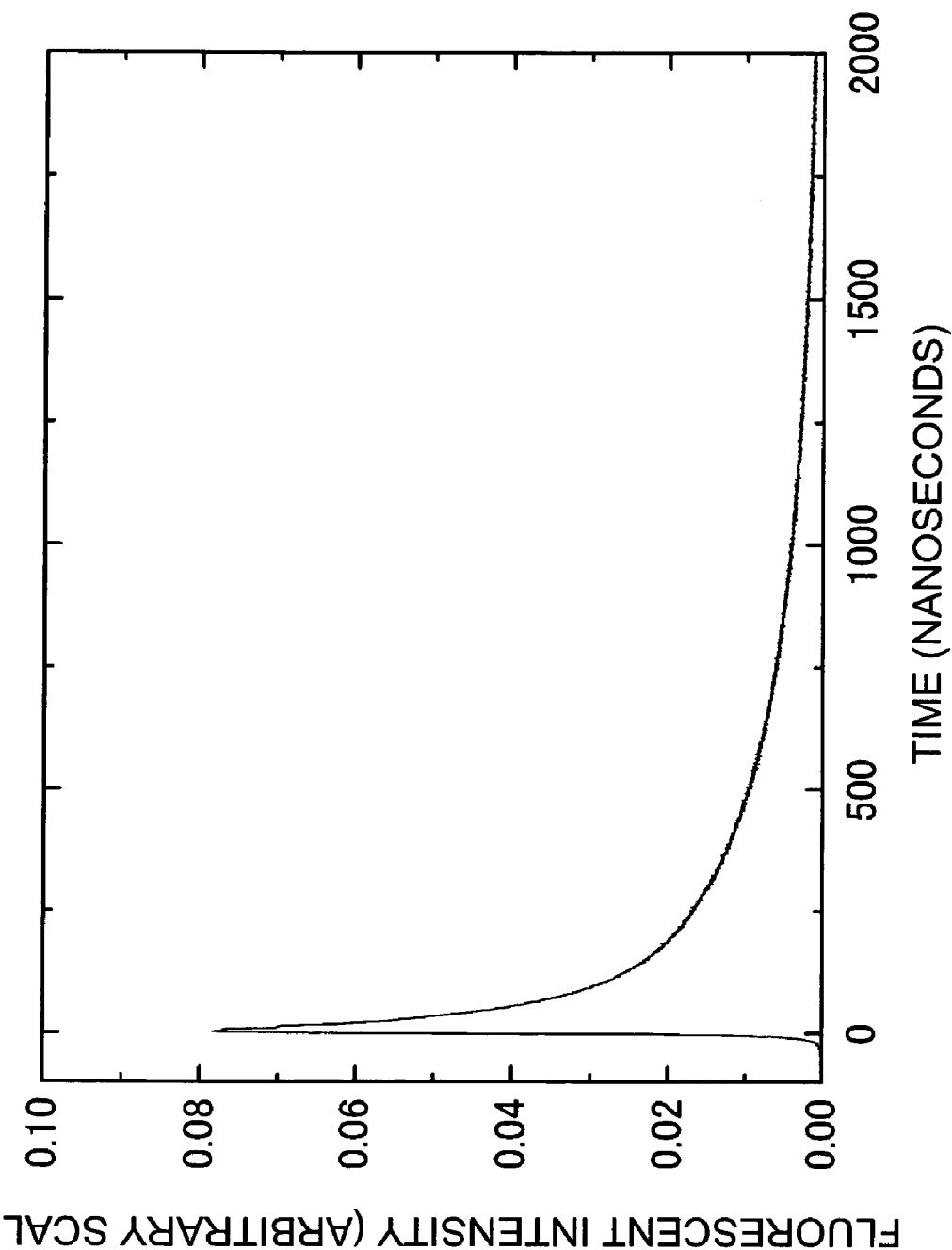
FIG. 4 is a graph showing time-dependent change in intensity of a fluorescent pulse outputted from an inorganic scintillator according to an example of the invention.

Polytetrafluoroethylene (PTFE) tape was covered as a reflective material onto five of the six sides of the (approximately cuboid) sample, excluding one of the sides with a size of 4 mm×6 mm (hereinafter referred to as "radiation incident side"). The sample was then placed with the radiation incident side lacking the PTFE tape covering positioned facing the photomultiplier side (photoelectric conversion side) of a photomultiplier tube (H1949™) by Hamamatsu Photonics and fixed using optical grease. Each sample was irradiated with 611 KeV radiation using $^{137}$Cs, and the time-dependent change in fluorescent output was measured using a digital oscilloscope (TDS3052™) by Techtronics. The measurement results are shown in the graph in FIG. 4, with time on the horizontal axis and fluorescent intensity on the vertical axis. The measurement indicated a fluorescent rise time of 1 nanosecond or shorter.

Example 2

In an Ir crucible having the same shape shown in FIG. 2 with a diameter of 50 mm, a height of 50 mm and a thickness of 1.5 mm there were loaded 262.67 g of gadolinium oxide ($Gd_2O_3$, 99.99 wt % purity), 124.02 g of lutetium oxide ($Lu_2O_3$, 99.99 wt % purity), 62.42 g of silicon dioxide ($SiO_2$, 99.99 wt % purity) and 0.89 g of cerium oxide ($CeO_2$, 99.99 wt % purity) as the starting materials, and 450.00 g of the mixture was obtained. The mixture was then heated to melting at 1950° C. or higher in a high-frequency induction heating furnace to obtain a melt (chemical composition of melt: $Ce_{0.005}Lu_{0.6}Gd_{1.395}SiO_5$) (melting step).

Next, the end of the lifting rod to which the seed crystal was anchored was placed in the melt for crystal growth. The seed crystal used was a cut-out single crystal composed of a metal oxide containing $Ce_{00.05}Lu_{0.6}Gd_{1.395}SiO_5$, obtained by an ordinary crystal growth method. After growth of the single crystal and before its cutting (trimming), the crystal structure was confirmed to be a single crystal belonging to the space group C2/c using a powder X-ray diffraction apparatus (RAD™, product of Rigaku Corp.).

Next, a single crystal ingot with a neck diameter of 8 mmφ was lifted at a lifting speed of 3-10 mm/h to form a neck section. The cone section (cylinder trunk) was then lifted, initiating lifting of the cylinder trunk when the diameter reached 23 mmφ. The cylinder trunk was grown, and then the single crystal ingot was cut off from the melt and cooling was initiated. After completion of the cooling, the obtained single crystal was cut out (cooling and solidification step). The obtained single crystal ingot had a crystal mass of about 200-300 g.

The obtained single crystal ingot had a crystal mass of about 230.90 g, a cone length of about 10 mm, a cylinder trunk length of about 70 mm and a cylinder trunk diameter of about 23 mm.

Figure 5:
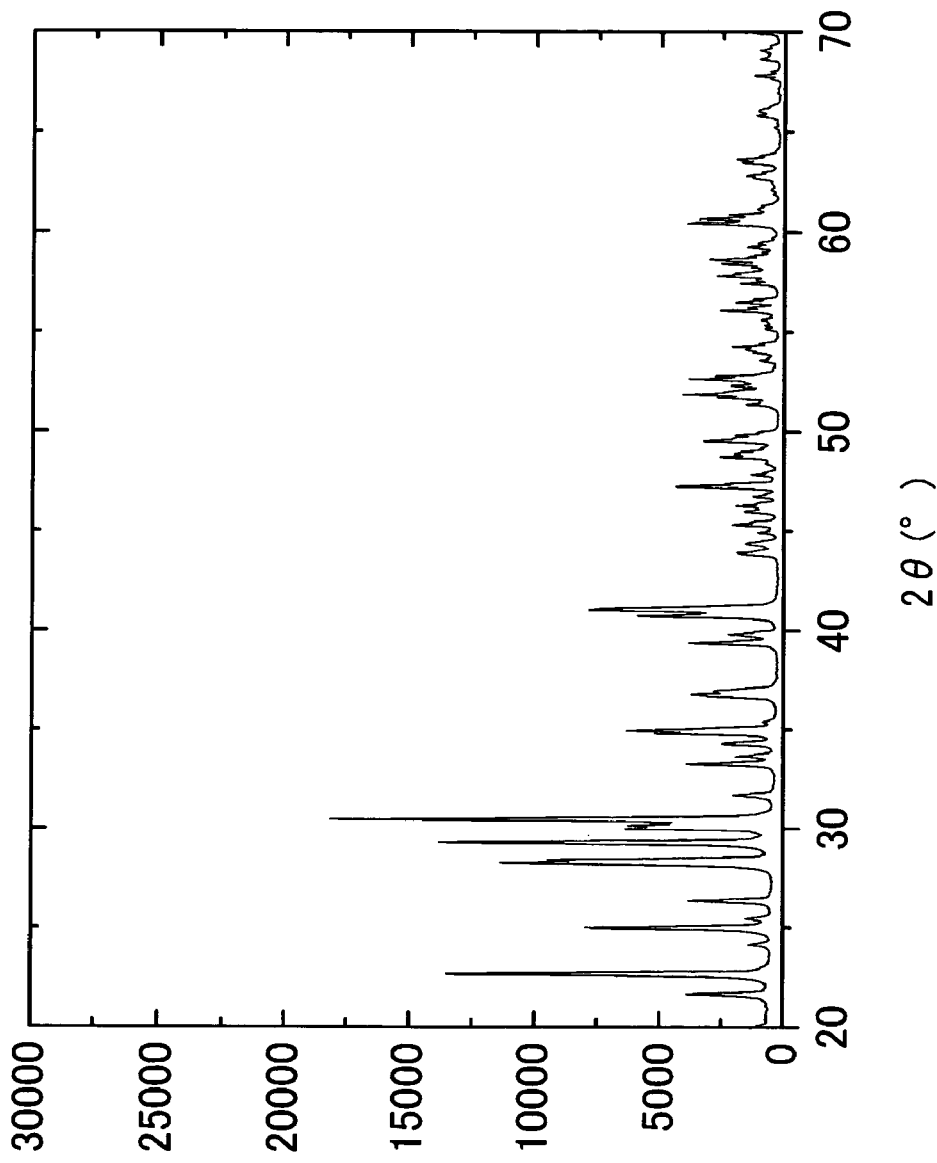
FIG. 5 shows an X-ray diffraction pattern for an inorganic scintillator according to an example of the invention.

Next, part of the bottom of the obtained single crystal was cut out and worked into powder. The resulting powder was combined with a silicon powder standard sample and the crystal structure was identified using a powder X-ray diffraction apparatus (RAD™, product of Rigaku Corp.). The resulting X-ray diffraction pattern is shown in FIG. 5. From the X-ray diffraction pattern it was demonstrated that the single crystal belonged to the space group C2/c, and had lattice constants a=14.459 Å, b=10.469 Å, c=6.748 Å, γ=122.2°.

Next, an approximately cuboid sample (inorganic scintillator single crystal) with a size of 4 mm×6 mm×20 mm was cut out from the obtained single crystal ingot (cutting step). An inner perimeter cutter was used for the cutting, and the blade of the inner perimeter cutter was a blade electrodeposited with #325-400 natural diamond.

Figure 6:
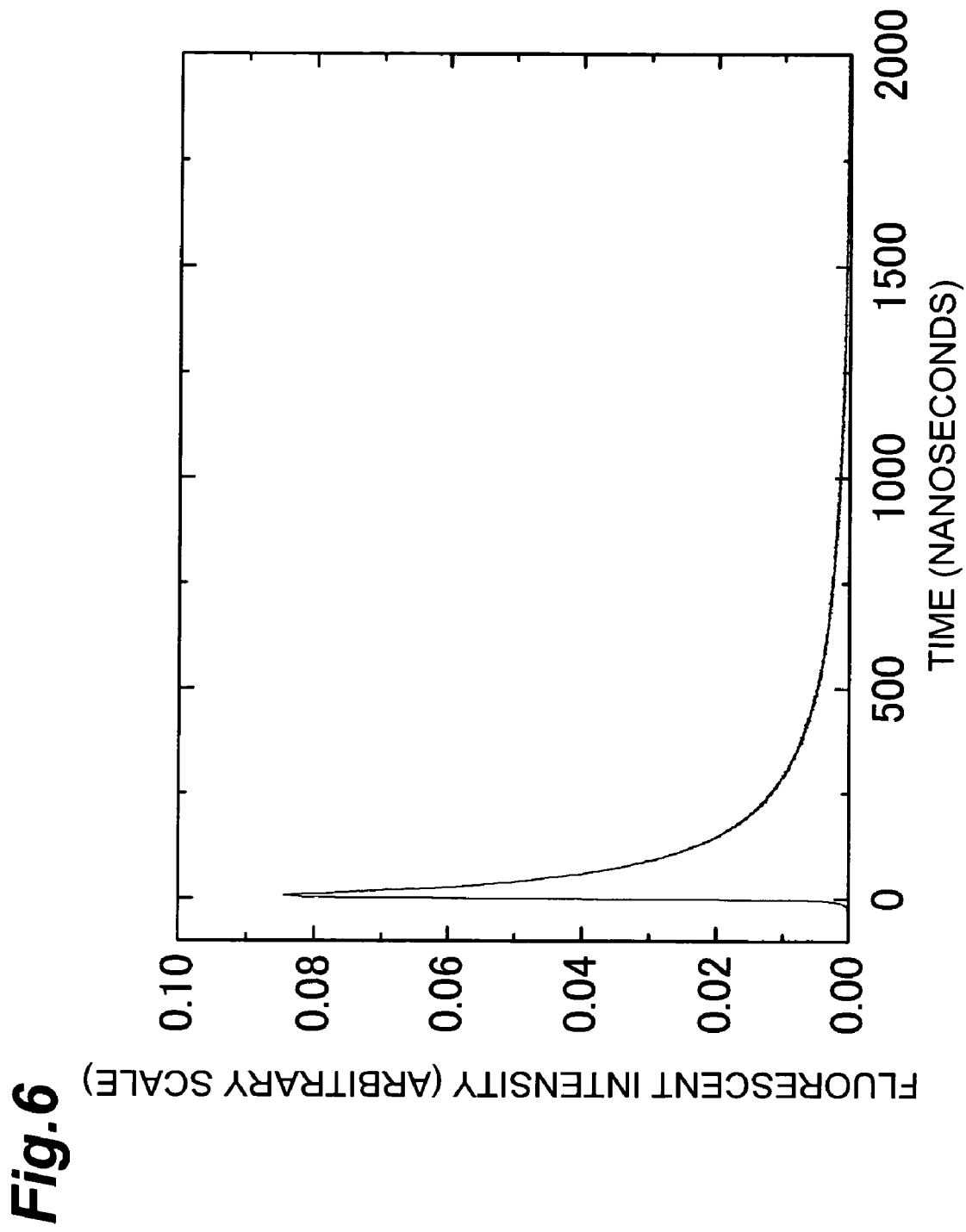
FIG. 6 is a graph showing time-dependent change in intensity of a fluorescent pulse outputted from an inorganic scintillator according to an example of the invention.

Polytetrafluoroethylene (PTFE) tape was covered as a reflective material onto five of the six sides of the (approximately cuboid) sample, excluding one of the sides with a size of 4 mm×6 mm (hereinafter referred to as "radiation incident side"). The sample was then placed with the radiation incident side lacking the PTFE tape covering positioned facing the photomultiplier side (photoelectric conversion side) of a photomultiplier tube (H1949™) by Hamamatsu Photonics and fixed using optical grease. Each sample was irradiated with 611 KeV radiation using $^{137}$Cs, and the time-dependent change in fluorescent output was measured using a digital oscilloscope (TDS3052™) by Techtronics. The measurement results are shown in the graph in FIG. 6, with time on the horizontal axis and fluorescent intensity on the vertical axis. The measurement indicated a fluorescent rise time of 1 nanosecond or shorter.

Example 3

In an Ir crucible having the same shape shown in FIG. 2 with a diameter of 50 mm, a height of 50 mm and a thickness of 1.5 mm there were loaded 273.54 g of gadolinium oxide ($Gd_2O_3$, 99.99 wt % purity), 86.10 g of lutetium oxide ($Lu_2O_3$, 99.99 wt % purity), 24.43 g of yttrium oxide ($Y_2O_3$, 99.99 wt % purity), 65.00 g of silicon dioxide ($SiO_2$, 99.99 wt % purity) and 0.93 g of cerium oxide ($CeO_2$, 99.99 wt % purity) as the starting materials, and 450.00 g of the mixture was obtained. The mixture was then heated to melting at 1950° C. or higher in a high-frequency induction heating furnace to obtain a melt (chemical composition of melt: $Ce_{0.005}Y_{0.2}Lu_{0.4}Gd_{1.395}SiO_5$) (melting step).

Next, the end of the lifting rod to which the seed crystal was anchored was placed in the melt for crystal growth. The seed crystal used was a cut-out single crystal composed of a metal oxide containing $Ce_{0.005}Y_{0.2}Lu_{0.4}Gd_{1.395}SiO_5$, obtained by an ordinary crystal growth method. After growth of the single crystal and before its cutting (trimming), the crystal structure was confirmed to be a single crystal belonging to the space group C2/c using a powder X-ray diffraction apparatus (RAD™, product of Rigaku Corp.).

Next, a single crystal ingot with a neck diameter of 8 mmφ was lifted at a lifting speed of 3-10 mm/h to form a neck section. The cone section (cylinder trunk) was then lifted, initiating lifting of the cylinder trunk when the diameter reached 23 mmφ. The cylinder trunk was grown, and then the single crystal ingot was cut off from the melt and cooling was initiated. After completion of the cooling, the obtained single crystal was cut out (cooling and solidification step).

The obtained single crystal ingot had a crystal mass of about 287.10 g, a cone length of about 10 mm, a cylinder trunk length of about 70 mm and a cylinder trunk diameter of about 23 mm.

Figure 9:
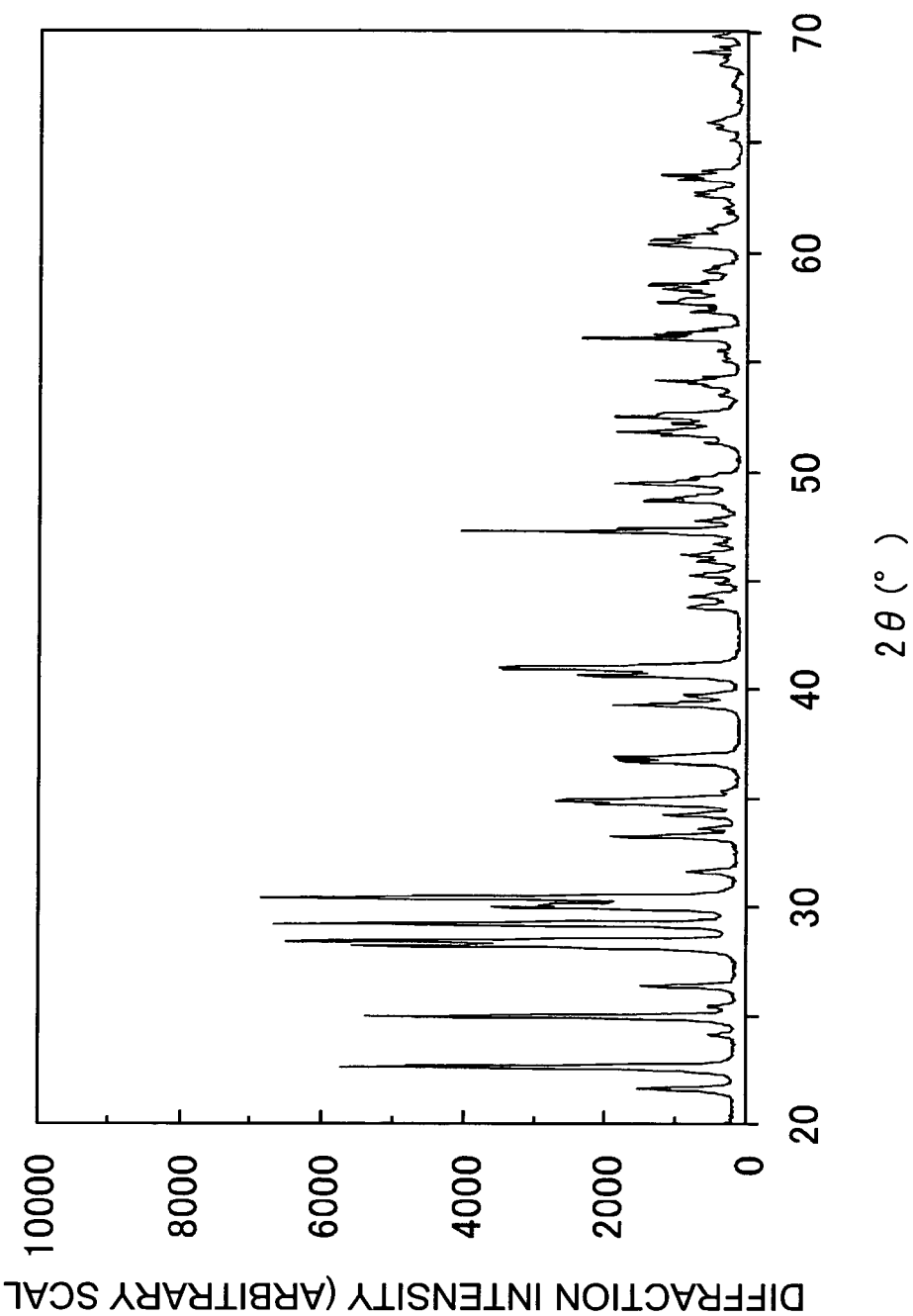
FIG. 9 shows an X-ray diffraction pattern for an inorganic scintillator according to an example of the invention.

Next, part of the bottom of the obtained single crystal was cut out and worked into powder. The resulting powder was combined with a silicon powder standard sample and the crystal structure was identified using a powder X-ray diffraction apparatus (RAD™, product of Rigaku Corp.). The resulting X-ray diffraction pattern is shown in FIG. 9. From the X-ray diffraction pattern it was demonstrated that the single crystal belonged to the space group C2/c, and had lattice constants a=14.479 Å, b=10.512 Å, c=6.760 Å, γ=122.2°.

Next, an approximately cuboid sample (inorganic scintillator single crystal) with a size of 4 mm×6 mm×20 mm was cut out from the obtained single crystal ingot (cutting step). An inner perimeter cutter was used for the cutting, and the blade of the inner perimeter cutter was a blade electrodeposited with #325-400 natural diamond.

Figure 10:
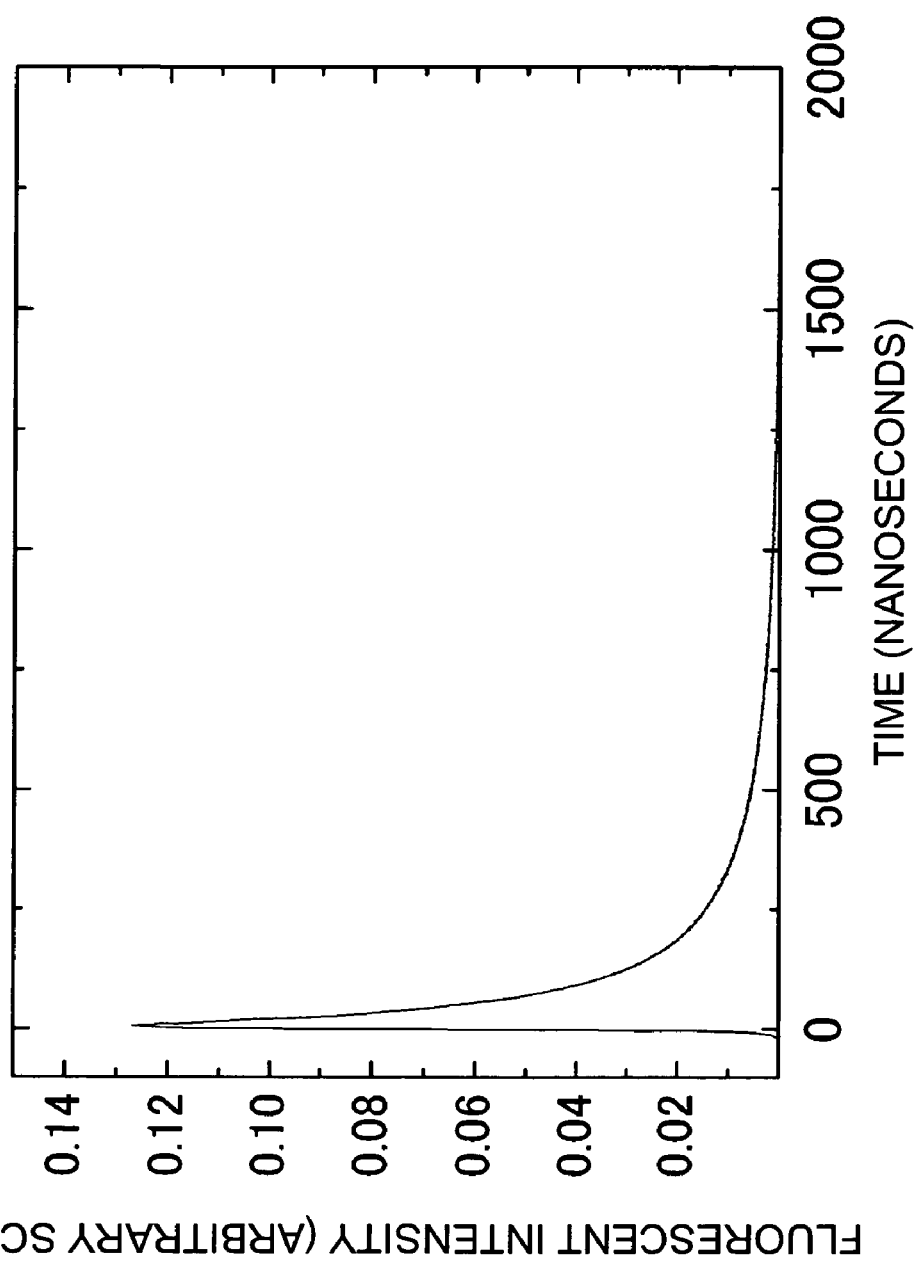
FIG. 10 is a graph showing time-dependent change in intensity of a fluorescent pulse outputted from an inorganic scintillator according to an example of the invention.

Polytetrafluoroethylene (PTFE) tape was covered as a reflective material onto five of the six sides of the (approximately cuboid) sample, excluding one of the sides with a size of 4 mm×6 mm (hereinafter referred to as "radiation incident side"). The sample was then placed with the radiation incident side lacking the PTFE tape covering positioned facing the photomultiplier side (photoelectric conversion side) of a photomultiplier tube (H1949™) by Hamamatsu Photonics and fixed using optical grease. Each sample was irradiated with 611 KeV radiation using $^{137}Cs$, and the time-dependent change in fluorescent output was measured using a digital oscilloscope (TDS3052™) by Techtronics. The measurement results are shown in the graph in FIG. 10, with time on the horizontal axis and fluorescent intensity on the vertical axis. The measurement indicated a fluorescent rise time of 1 nanosecond or shorter.

Comparative Example 1

In an Ir crucible having the same shape shown in FIG. 2 with a diameter of 50 mm, a height of 50 mm and a thickness of 1.5 mm there were loaded 344.34 g of gadolinium oxide ($Gd_2O_3$, 99.99 wt % purity), 42.02 g of lutetium oxide ($Lu_2O_3$, 99.99 wt % purity), 63.45 g of silicon dioxide ($SiO_2$, 99.99 wt % purity) and 0.18 g of cerium oxide ($CeO_2$, 99.99 wt % purity) as the starting materials, and 449.99 g of the mixture was obtained. The mixture was then heated to melting at 1950° C. or higher in a high-frequency induction heating furnace to obtain a melt (chemical composition of melt: $Ce_{0.001}Lu_{0.2}Gd_{1.799}SiO_5$)

Next, a lifting rod having an indium metal wire (1 mmφ× 200 mm) anchored at the tip was placed in the melt from the tip end for crystal growth. The temperature of the melt was lowered to solidify and crystallize the melt on the indium metal wire surface, and this crystal was used as the seed crystal for single crystal growth.

Next, a single crystal ingot with a neck diameter of 8 mmφ was lifted at a lifting speed of 3-10 mm/h to form a neck section. The cone section (cylinder trunk) was then lifted, initiating lifting of the cylinder trunk when the diameter reached 25 mmφ. The cylinder trunk was grown, and then the single crystal ingot was cut off from the melt and cooling was initiated. After completion of the cooling, the obtained single crystal was cut out.

The obtained single crystal ingot had a crystal mass of about 290.37 g, a cone length of about 10 mm, a cylinder trunk length of about 70 mm and a cylinder trunk diameter of about 25 mm.

Figure 7:
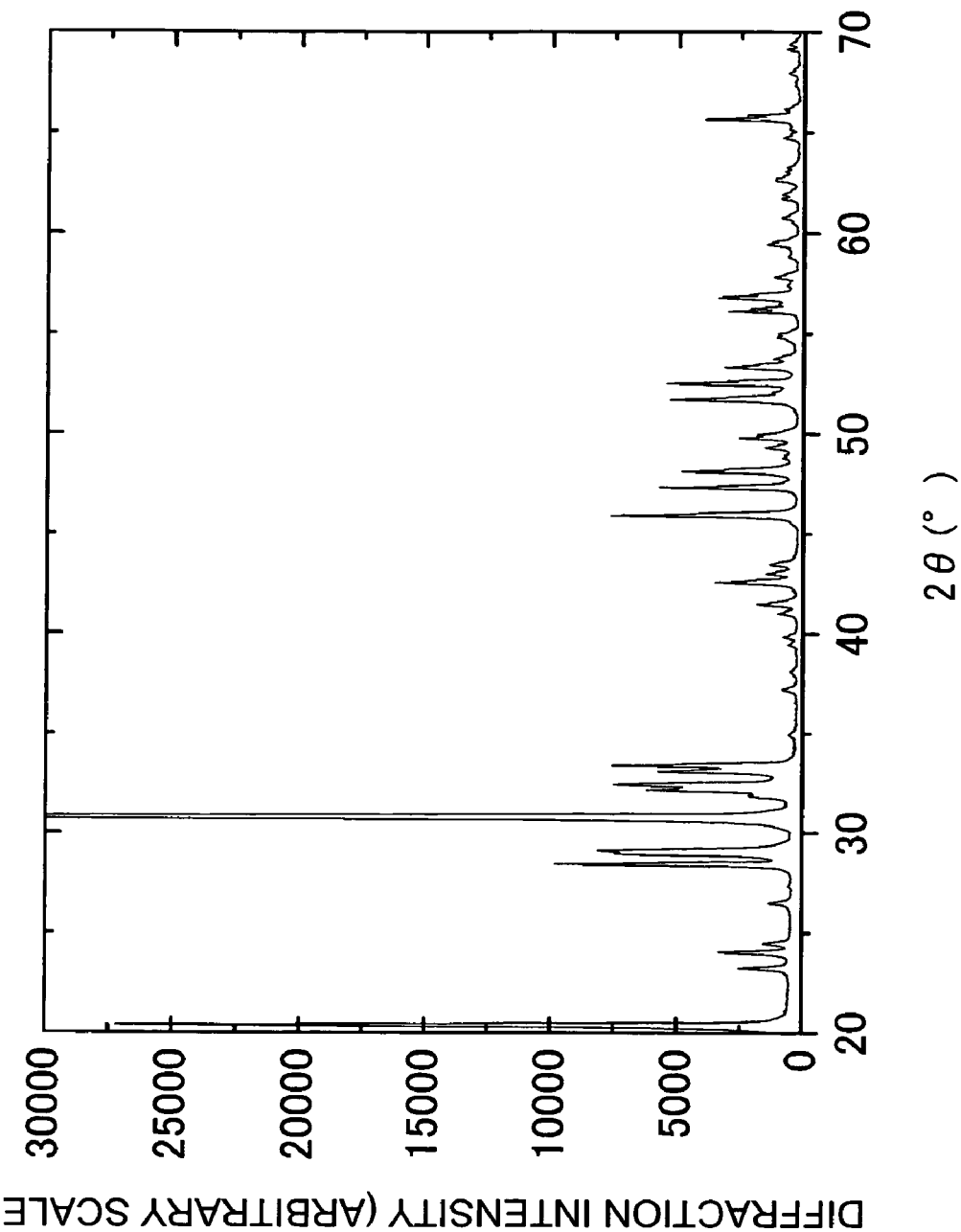
FIG. 7 shows an X-ray diffraction pattern for an inorganic scintillator according to a comparative example.

Next, part of the bottom of the obtained single crystal was cut out and worked into powder. The resulting powder was combined with a silicon powder standard sample and the crystal structure was identified using a powder X-ray diffraction apparatus (RAD™, product of Rigaku Corp.). The resulting X-ray diffraction pattern is shown in FIG. 7. From the X-ray diffraction pattern it was demonstrated that the single crystal belonged to the space group $P2_1/c$, and had lattice constants a=9.128 Å, b=7.020 Å, c=6.737 Å, β=107.5°.

Next, an approximately cuboid sample (inorganic scintillator single crystal) with a size of 4 mm×6 mm×20 mm was cut out from the obtained single crystal ingot. An inner perimeter cutter was used for the cutting, and the blade of the inner perimeter cutter was a blade electrodeposited with #325-400 natural diamond.

Figure 8:
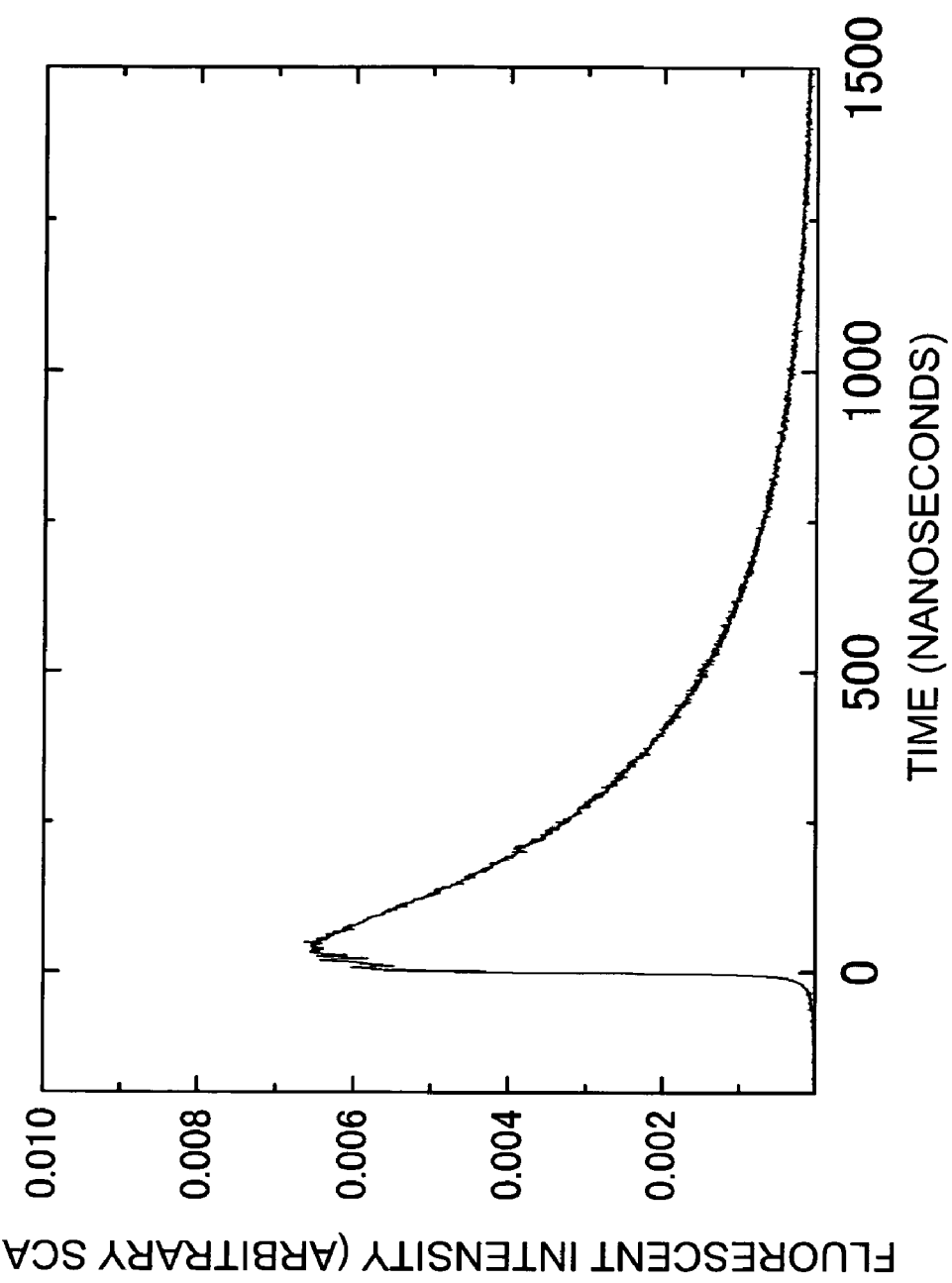
FIG. 8 is a graph showing time-dependent change in intensity of a fluorescent pulse outputted from an inorganic scintillator according to a comparative example.

Polytetrafluoroethylene (PTFE) tape was covered as a reflective material onto five of the six sides of the (approximately cuboid) sample, excluding one of the sides with a size of 4 mm×6 mm (hereinafter referred to as "radiation incident side"). The sample was then placed with the radiation incident side lacking the PTFE tape covering positioned facing the photomultiplier side (photoelectric conversion side) of a photomultiplier tube (H1949™) by Hamamatsu Photonics and fixed using optical grease. Each sample was irradiated with 611 KeV radiation using $^{137}Cs$, and the time-dependent change in fluorescent output was measured using a digital oscilloscope (TDS3052™) by Techtronics. The measurement results are shown in the graph in FIG. 8, with time on the horizontal axis and fluorescent intensity on the vertical axis. The measurement indicated a fluorescent rise time of 25 nanoseconds.

As clearly shown by the results from Examples 1 and 2, the inorganic scintillators of these examples were confirmed to have much shorter fluorescent rise times compared to the inorganic scintillator of Comparative Example 1.

What is claimed is:

1. An inorganic scintillator capable of producing scintillation by radiation, which is a crystal comprising a metal oxide containing Lu, Gd, Ce Si and Y and belonging to space C2/c monoclinic crystals, and which satisfies the condition specified by the following inequality:

$$\{(A_{Lu}+A_Y)/(A_{Lu}+A_Y+A_{Gd})\}<0.50$$

wherein $A_{Lu}$ represents the number of Lu atoms in the crystal, $A_Y$ represents the number of Y atoms in the crystal, and $A_{Gd}$ represents the number of Gd atoms in the crystal.

2. An inorganic scintillator according to claim 1 which satisfies the condition specified by the following inequality.

$$0.10<\{A_{Lu}/(A_{Lu}+A_{Gd})\}<0.40$$

3. An inorganic scintillator according to claim 1 which satisfies the condition specified by the following inequality:

$$0.10<\{A_{Lu}/(A_{Lu}+A_{Gd})\}<0.40$$

4. An inorganic scintillator according to claim 1 which is a single crystal.

* * * * *

UNITED STATES PATENT AND TRADEMARK OFFICE
CERTIFICATE OF CORRECTION

PATENT NO. : 7,510,671 B2  
APPLICATION NO. : 11/154824  
DATED : March 31, 2009  
INVENTOR(S) : Kazuhisa Kurashige et al.

Page 1 of 1

It is certified that error appears in the above-identified patent and that said Letters Patent is hereby corrected as shown below:

Col. 12, Lines 66-67 and Col. 13, Lines 1-11, should read as follows:

1. An inorganic scintillator capable of producing scintillation by radiation, which is a crystal
   comprising a metal oxide containing Lu, Gd, Ce Si and Y and
   belonging to space group C2/c monoclinic crystals, and
   which satisfies the condition specified by the following inequality:
   $\{(A_{Lu} + A_Y)/(A_{Lu} + A_Y + A_{Gd})\} < 0.50$
wherein $A_{Lu}$ represents the number of Lu atoms in the crystal, $A_Y$ represents the number of Y atoms in the crystal, and $A_{Gd}$ represents the number of Gd atoms in the crystal.

Col. 13, Lines 5-7, should read as follows:

3. An inorganic scintillator according to claim 3 which satisfies the condition specified by the following inequality:
   $0.10 < \{(A_{Lu} + A_Y)/(A_{Lu} + A_Y + A_{Gd})\} < 0.40$ Signed and Sealed this Twenty-first Day of July, 2009

JOHN DOLL  
*Acting Director of the United States Patent and Trademark Office*

UNITED STATES PATENT AND TRADEMARK OFFICE
CERTIFICATE OF CORRECTION

PATENT NO. : 7,510,671 B2  
APPLICATION NO. : 11/154824  
DATED : March 31, 2009  
INVENTOR(S) : Kazuhisa Kurashige et al.

Page 1 of 1

It is certified that error appears in the above-identified patent and that said Letters Patent is hereby corrected as shown below:

Col. 12, Lines 66-67 and Col. 13, Lines 1-11, should read as follows:

1. An inorganic scintillator capable of producing scintillation by radiation, which is a crystal
   comprising a metal oxide containing Lu, Gd, Ce Si and Y and
   belonging to space group C2/c monoclinic crystals, and
   which satisfies the condition specified by the following inequality:
   $\{(A_{Lu} + A_Y)/(A_{Lu} + A_Y + A_{Gd})\} < 0.50$
wherein $A_{Lu}$ represents the number of Lu atoms in the crystal, $A_Y$ represents the number of Y atoms in the crystal, and $A_{Gd}$ represents the number of Gd atoms in the crystal.

Col. 13, Lines 5-7, should read as follows:

3. An inorganic scintillator according to claim 1 which satisfies the condition specified by the following inequality:
   $0.10 < \{(A_{Lu} + A_Y)/(A_{Lu} + A_Y + A_{Gd})\} < 0.40$ This certificate supersedes the Certificate of Correction issued July 21, 2009.

Signed and Sealed this

Twenty-second Day of September, 2009

David J. Kappos  
*Director of the United States Patent and Trademark Office*

UNITED STATES PATENT AND TRADEMARK OFFICE
CERTIFICATE OF CORRECTION

PATENT NO. : 7,510,671 B2
APPLICATION NO. : 11/154824
DATED : March 31, 2009
INVENTOR(S) : Kazuhisa Kurashige et al.

It is certified that error appears in the above-identified patent and that said Letters Patent is hereby corrected as shown below:

Col. 12, Lines 66-67 and Col. 13, Lines 1-11, should read as follows:

1. An inorganic scintillator capable of producing scintillation by radiation, which is a crystal
    comprising a metal oxide containing Lu, Gd, Ce Si and Y and
    belonging to space group C2/c monoclinic crystals, and
    which satisfies the condition specified by the following inequality:
    $\{(A_{Lu} + A_Y)/(A_{Lu} + A_Y + A_{Gd})\} < 0.50$
wherein $A_{Lu}$ represents the number of Lu atoms in the crystal, $A_Y$ represents the number of Y atoms in the crystal, and $A_{Gd}$ represents the number of Gd atoms in the crystal.

Col. 14, Lines 5-7, should read as follows:

3. An inorganic scintillator according to claim 1 which satisfies the condition specified by the following inequality:
    $0.10 < \{(A_{Lu} + A_Y)/(A_{Lu} + A_Y + A_{Gd})\} < 0.40$ This certificate supersedes the Certificates of Correction issued July 21, 2009 and September 22, 2009.

Signed and Sealed this

Fifteenth Day of December, 2009

David J. Kappos
*Director of the United States Patent and Trademark Office*